United States Patent [19]
Ran

[11] Patent Number: 5,654,702
[45] Date of Patent: Aug. 5, 1997

[54] SYNTAX-BASED ARITHMETIC CODING FOR LOW BIT RATE VIDEOPHONE

[75] Inventor: Xiaonong Ran, Cupertino, Calif.

[73] Assignee: National Semiconductor Corp., Santa Clara County, Calif.

[21] Appl. No.: 359,241

[22] Filed: Dec. 16, 1994

[51] Int. Cl.⁶ ..................................... H03M 7/30
[52] U.S. Cl. ..................... 341/51; 341/107; 382/247
[58] Field of Search ............................ 341/51, 65, 67, 341/107; 382/247

[56] References Cited

U.S. PATENT DOCUMENTS

| | | | |
|---|---|---|---|
| 4,488,143 | 12/1984 | Martin | 340/347 AD |
| 4,652,856 | 3/1987 | Mohiuddin et al. | 340/347 AD |
| 5,045,852 | 9/1991 | Mitchell et al. | 341/51 |
| 5,272,478 | 12/1993 | Allen | 341/107 |
| 5,418,532 | 5/1995 | Lei | 341/107 |

OTHER PUBLICATIONS

Pennebaker et al., "An Overview of the Basic Principles of the Q–Coder Adaptive Binary Arithmetic Coder," IBM J. Res. Develop., vol. 32, No. 6, Nov., 1988, pp. 717–726.

*Primary Examiner*—Jeffrey A. Gaffin
*Assistant Examiner*—Jason L. W. Kost
*Attorney, Agent, or Firm*—Skjerven, Morrill, MacPherson, Franlin & Friel; David T. Millers

[57] ABSTRACT

A variable length coding process encodes a string of symbol values using arithmetic coding models selected according to the syntax of the string. The arithmetic coding models are optimized for each separate symbol in the string to provide efficient coding that provides a shorter average code length than is provided with arithmetic coding using a single model. In an embodiment for moving image coding, two sets of arithmetic coding models, one for intra frames and one for inter frames, are used for a series symbols representing DCT blocks. The model used for a symbol depends of the symbol's value and order in the series.

19 Claims, 7 Drawing Sheets

| 1  | 2  | 6  | 7  | 15 | 16 | 28 | 29 |
|----|----|----|----|----|----|----|----|
| 3  | 5  | 8  | 14 | 17 | 27 | 30 | 43 |
| 4  | 9  | 13 | 18 | 26 | 31 | 42 | 44 |
| 10 | 12 | 19 | 25 | 32 | 41 | 45 | 54 |
| 11 | 20 | 24 | 33 | 40 | 46 | 53 | 55 |
| 21 | 23 | 34 | 39 | 47 | 52 | 56 | 61 |
| 22 | 35 | 38 | 48 | 51 | 57 | 60 | 62 |
| 36 | 37 | 49 | 50 | 58 | 59 | 63 | 64 |

SYNTAX-BASED ARITHMETIC CODING FOR LOW BIT RATE VIDEOPHONE

REFERENCE TO MICROFICHE APPENDIX

The present specification comprises a microfiche appendix. The total number of microfiche sheets in the microfiche appendix is three (3). The total number of frames in the microfiche appendix is 163.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

This invention relates to low-bit rate digital transmission of moving images such as in videophone communications over conventional phone lines.

2. Description of Related Art

PSTN Phone lines are commonly used for digital communications between computers or other devices using modems and standard communications protocols. Such communication protocols have bit rates limited by the quality of transmission over the phone lines. For example, the V.FAST standard has a bit rate of between 16.8 and 28.8 kbit/s depending on the quality of the connection. These bit rates are low when compared to the requirements for transmitting high quality digital moving images.

Conventional digital moving images are a succession of frames (or still images) which are commonly represented by two-dimensional arrays of pixel values. The pixel values indicate colors or intensities of pixels in the frames. Transmission of pixel values by videophones is impractical because of the large amount of data required to transmit every pixel value in every frame of a moving picture. Accordingly, typical videophone systems contain an encoding circuit which converts a succession of frames (two-dimensional arrays) into a compressed representation of the moving image.

FIG. 1 shows a video encoding portion of a videophone which generates a compressed representation of a moving image. An input video signal VIDEO_IN from a video camera or other video source indicates pixel values in frames of the moving image. An information extracting circuit 110 converts the representation of the moving image to a format where redundant information is more easily removed. For example, difference-frame coding subtracts pixel values from a current frame from pixel values in a preceding frame and extracts non-zero values which indicate changes between the frames. Redundant data, that are repeated in successive frames, appear as zero values in the difference, and the large number of zero values can be effectively compressed or removed.

Motion estimation reduces the number of non-zero values in the difference between frames by subtracting a block having a position indicated by a motion vector in a preceding frame from a block in a current frame. The motion vector is selected to reduce the difference. Additionally, blocks may be transformed using transformations such as a discrete cosine transformation (DCT) or a Walsh transformation. Such transformations provide a block of coefficients having few non-zero values and long runs of zero values. Typically, information extracting circuit 110 quantizes the transformed blocks and converts the transformed block into a series of symbols. A symbol may indicate, for example, a non-zero value in the block and a number of consecutive, zero values in a run preceding the non-zero value.

A coding block 120 codes symbols for transmission. One well known variable length coding technique, commonly referred to as Huffman coding, matches each symbol to a Huffman code in a table. The table is constructed so that the most common symbols have the Huffman codes with the fewest bits so that on average coding block 120 reduces the number of bits required to express a string of symbols.

A problem in prior art Huffman coding is that the bitstream representing a moving image commonly contains symbols indicating motion vectors, symbols indicating image parameters, and symbols indicating the start of a frame or block. Coding block 120 typically does not efficiently code these symbols because the values of the symbols have statistical distributions that differ from the statistical distributions of symbols representing difference blocks. Further, although Huffman coding reduces the number of bits in a description of a moving image, more efficient symbol coding would allow further improvements image quality at low bit rates.

Arithmetic coding is known in fields other than moving image coding. Arithmetic coding, instead of encoding individual symbols as does Huffman coding, encodes strings of symbols. FIG. 2 illustrates an example of arithmetic coding. In the example, the set of possible values for each symbol is {a, e, i, o, u, !}, and the string encoded is "eaii!". Symbol "!" indicates the end of a string. An arithmetic coding model for the symbol divides an interval into segments which have lengths proportional to the probability of the symbol occurring in a string. In FIG. 2, the probabilities for symbols a, e, i, o, u, and ! are 20%, 30%, 10%, 20%, 10%, and 10%; and the model divides the interval [0,1) into segments [0,0.2), [0.2,0.5), [0.5,0.6), [0.6,0.8), [0.8,0.9), and [0.9,1.0) which correspond to symbols a, e, i, o, u, and ! respectively.

To determine a code value within interval [0,1), the interval [0,1) is divided according to the model, and a segment [0.2,0.5) corresponding to symbol e, the first symbol in string eaii!, is selected. The selected segment [0.2,0.5) is divided according to the model into segments [0.2,0.26), [0.26,0.35), [0.35,0.38), [0.38,0.44), [0.44,0.47), and [0.47, 0.5) corresponding to symbols a, e, i, o, u, ! respectively, and the segment [0.2,0.26) corresponding to symbol a, the second symbol of "eaii!", is selected. Partitioning and selecting of segments is repeated for the remaining symbols i, i, and ! and results in a final selection of the interval [0.23354, 0.2336) which corresponds to string "eaii!". Arithmetic coding selects from the selected final interval a code value that requires the minimum number of bits to express. For the example string of FIG. 2, code value 0.233581542 is 0.0011101111011 binary.

The prior art has not provided an efficient way employ arithmetic coding in moving image encoding where strings containing differing kinds of symbols have different ranges of possible values and different statistics.

SUMMARY OF THE INVENTION

In accordance with an embodiment of this invention, a process for variable length coding a string of symbol values employs a first arithmetic coding model for a first symbol value from the string and a second arithmetic coding model, which differs from the first, for a second symbol value from the string. Successive intervals are partitioned according to different models which are derived from different statistical distributions. The correct model for a symbol value is determined from a predefined syntax for the string. Accordingly, syntax-based adaptive arithmetic encoding in accordance with this invention can efficiently encode symbol values not encoded in the prior art and can efficiently combine symbols having different statistics into a single code. Encoding according to this embodiment is more efficient than prior art arithmetic coding in that the average length of codes generated in accordance with this invention is shorter than the average code length generated using a single arithmetic coding model for all values in a string.

One particular embodiment of the invention employs multiple arithmetic coding models for encoding symbols representing a discrete cosine transform (DCT) of a difference block. Symbols representing the top-left coefficients of the DCT of the difference block have different statistics and a matching arithmetic coding model, and a different arithmetic coding model is used for coefficients further from the top-left corner.

Another embodiment of the invention is a videophone including an information extracting block which generates a series of symbol values representing a moving image, and a coding block which encodes strings of symbol values from the series using a syntax-base adaptive arithmetic coding process. Typically, the coding block includes: a memory which stores a plurality of arithmetic coding models; a syntax decoder which selects from the memory a model which, according to a predetermined syntax for the series, corresponds to a symbol value in the series; an arithmetic coder which encodes each symbol value from a string into a code value according to the corresponding arithmetic coding model selected by the syntax decoder.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an embodiment of the invention, a coding block performs arithmetic coding using different arithmetic coding models for different symbols in a message. The model being used changes according to the syntax of the message being coded. For example, the syntax of the message indicates the meaning of each symbol in the message, and the statistical distribution of values for a symbol typically depends on meaning of the symbol. A different arithmetic coding model selected according to the syntax of the message may be used for each symbol. Syntax-based arithmetic coding in accordance with the invention produces a single code value determined from a string of symbols and multiple models.

Symbol values of the same type can also be coded using different models. For example, a string of symbols representing coefficients of a transformed difference block can be arithmetically coded using a first arithmetic coding model for the first symbol and a second arithmetic coding model for the second symbol. The model used for a symbol is determined by the order or position of the symbol in the message, and the model can be based on statistics for a symbol in that position. This is useful for example because a first symbol often indicates a large coefficient and a short run of zeros while following coefficients indicate smaller coefficients with longer runs of zeros. If the syntax of a message defines, a different order for the symbols, the order in which the arithmetic models are used changes to match the syntax.

Figure 1:
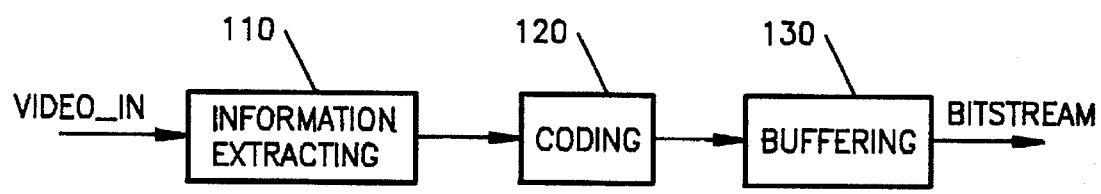
FIG. 1 shows a block diagram of a video encoding portion of a videophone.
Figure 2:
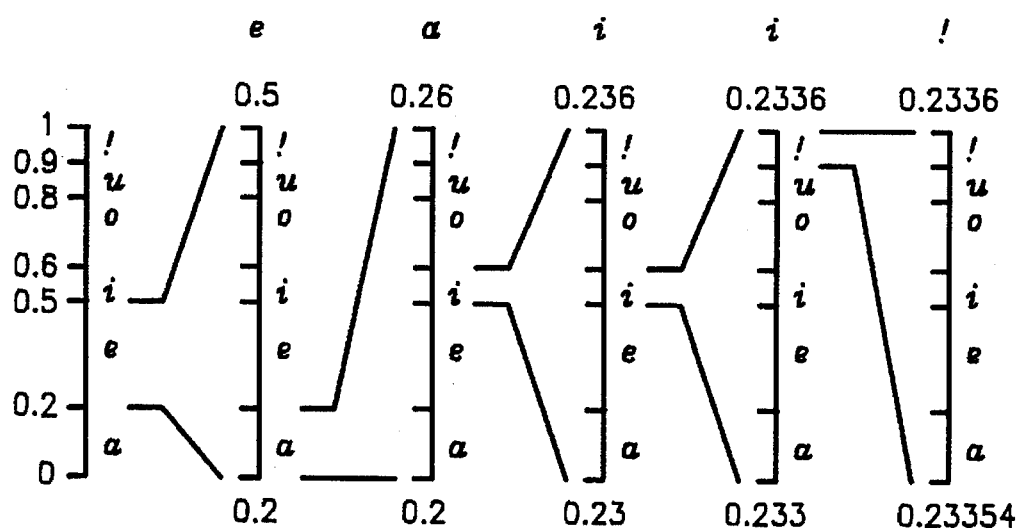
FIG. 2 illustrates arithmetic coding of a string of symbols.
Figure 3:
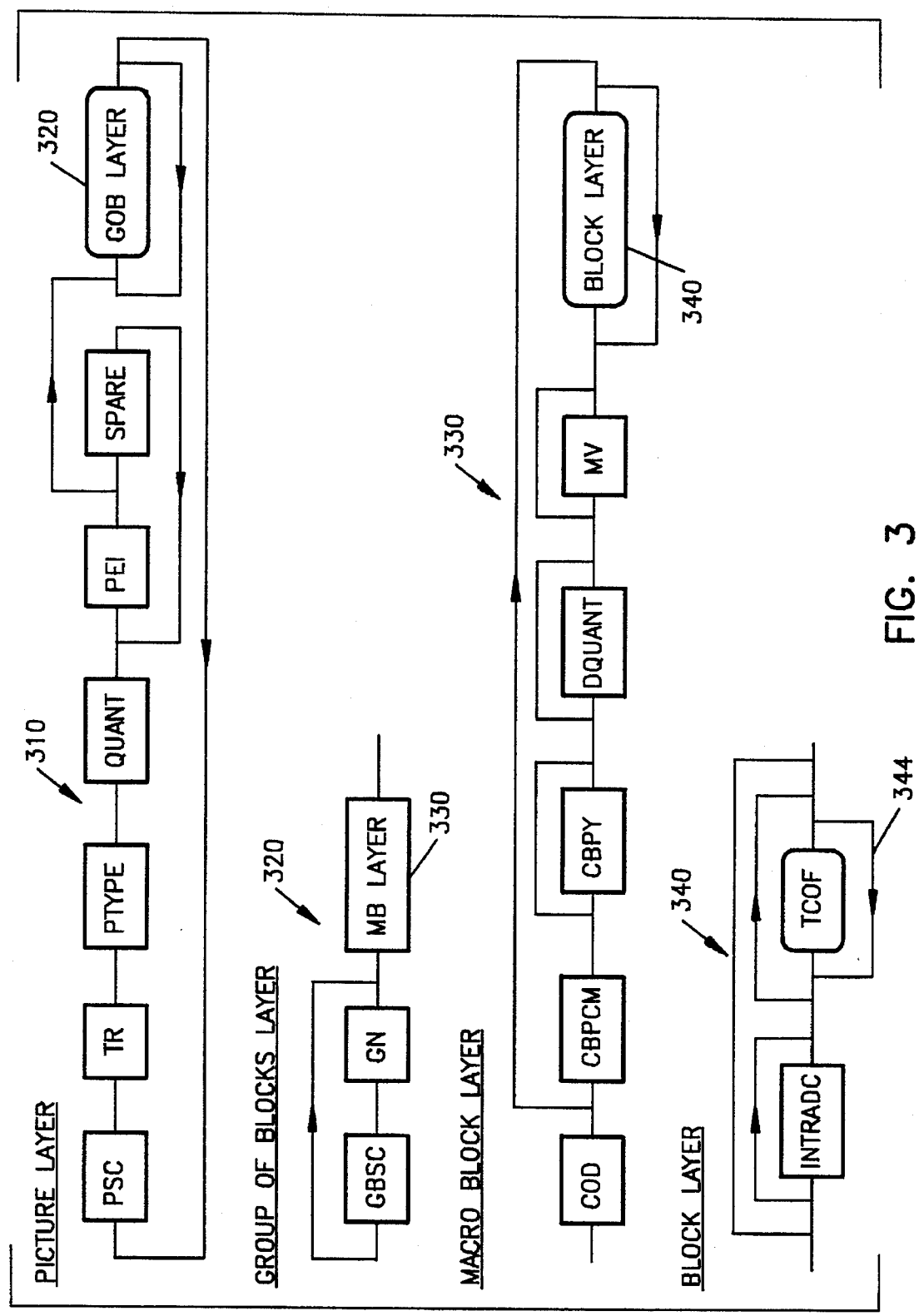
FIG. 3 illustrates an example of a syntax for a series of symbols describing a moving image.

FIG. 3 illustrates an example of a syntax for a representation of a moving image. This syntax is described in NTR "Video Codec Test Model, TMN4 Rev1", *ITU Telecommunication Standardization Sector, Study Group* 15, *Working Party* 15/1, LBC-94-, Oct. 25, 1994 which is incorporated by reference here in its entirety. Of particular relevance to this disclosure is that the syntax shown in FIG. 3 contains many symbols PSC, TR, PTYPE, QUANT, PEI, SPARE, GBSC, GN, COD, CBPCM, CBPY, DQUANT, MV, INTRADC, and TCOF, each of which has a different meaning and a different statistical distribution of values.

For the syntax of FIG. 3, three two-dimensional arrays, one for each color component Y, U, and V, represent a current frame. If the current frame differs greatly from a previous frame, the current frame is referred to as an intra-frame, and each array is divided into 16-by-16 pixel blocks referred to as an intra-block.

If the current frame is sufficiently similar to a previous frame, the current frame is referred to as an inter-frame, and each array is divided into 16-by-16 pixel blocks. For inter-frames, motion estimation determines motion vectors which indicate the blocks in the previous frame which closely match the blocks in the current frame. Inter-blocks are the difference between a block in the current frame and a closely matching block in the previous frame. If a block in the current inter-frame has no closely matching block in the previous frame, an intra-block is used which contains the pixel values of the block rather than a difference.

Different color components Y, U, V are treated differently. 16-by-16 blocks for an intensity component Y are handled as four 8-by-8 blocks. Each 16-by-16 block for color components U and V is converted to a single 8-by-8 block by combining a set of four pixel values in the 16-by-16 block to generate one value in the 8-by-8 block. This reduces the amount of data at the expense of losing information that is less important to picture quality. A macro block is a set of six 8-by-8 blocks, four for the Y component, one for the U component, and one for the V component.

Each frame of a moving image is indicated by a picture layer message 310 that starts with a symbol PSC having the value of a picture start code, for example 1000 0000 0000 0001 0000 binary. Following symbol PSC is a symbol TR which is a time reference indicating the position of the frame in the succession of frames. A picture type symbol PTYPE follows symbol TR and indicates frame parameters such as frame size and whether the frame is an intra-frame or an inter-frame. Symbol QUANT follows symbol PTYPE and indicates the step size used for quantizing DCT coefficients.

Symbol PEI is an extra information flag bit. An 8-bit symbol SPARE containing user defined information follows symbol PEI when symbol PEI has value 1. Following the symbol SPARE is another symbol PEI which indicates if there is another SPARE symbol. After the first symbol PEI which equals zero is a GOB layer 320 message which describes a group of blocks in the frame.

In GOB layer, 320 Symbols GBSC and GN are the start code for a row of macroblock and a number identifying the macroblock row as described in the above incorporated reference. Symbols GBSC and GN are optional and may be skipped by proceeding directly to a macroblock layer 330.

MB layer 330 begins with a symbol COD which indicates whether the message contains a description of a group of macroblocks. If a group is not described, the remaining symbols in the macroblock layer are skipped. Symbols CBPCM and CBPY indicate which of the 8-by-8 color component blocks in a macroblock are described and whether each color component block is an intra-block or an inter-block. Symbols DQUANT and MV indicate the quantization technique, a step size change, and x and y component changes for the motion vector corresponding to the macroblock. Symbol INTRADC represents the DC component of a discrete cosine transformation (DCT) of an intra-block and is skipped for inter-blocks. Symbol TCOF is repeated to provide a series of values representing the remaining coefficients of an intra-block or all of the coefficients of an inter-block.

The syntax illustrated in FIG. 3 is only an example of one message syntax in which an embodiment of the invention may be employed. As will be apparent from this disclosure, other embodiments of the invention may be employed in an almost limitless variety of other message syntaxes.

Figure 4:
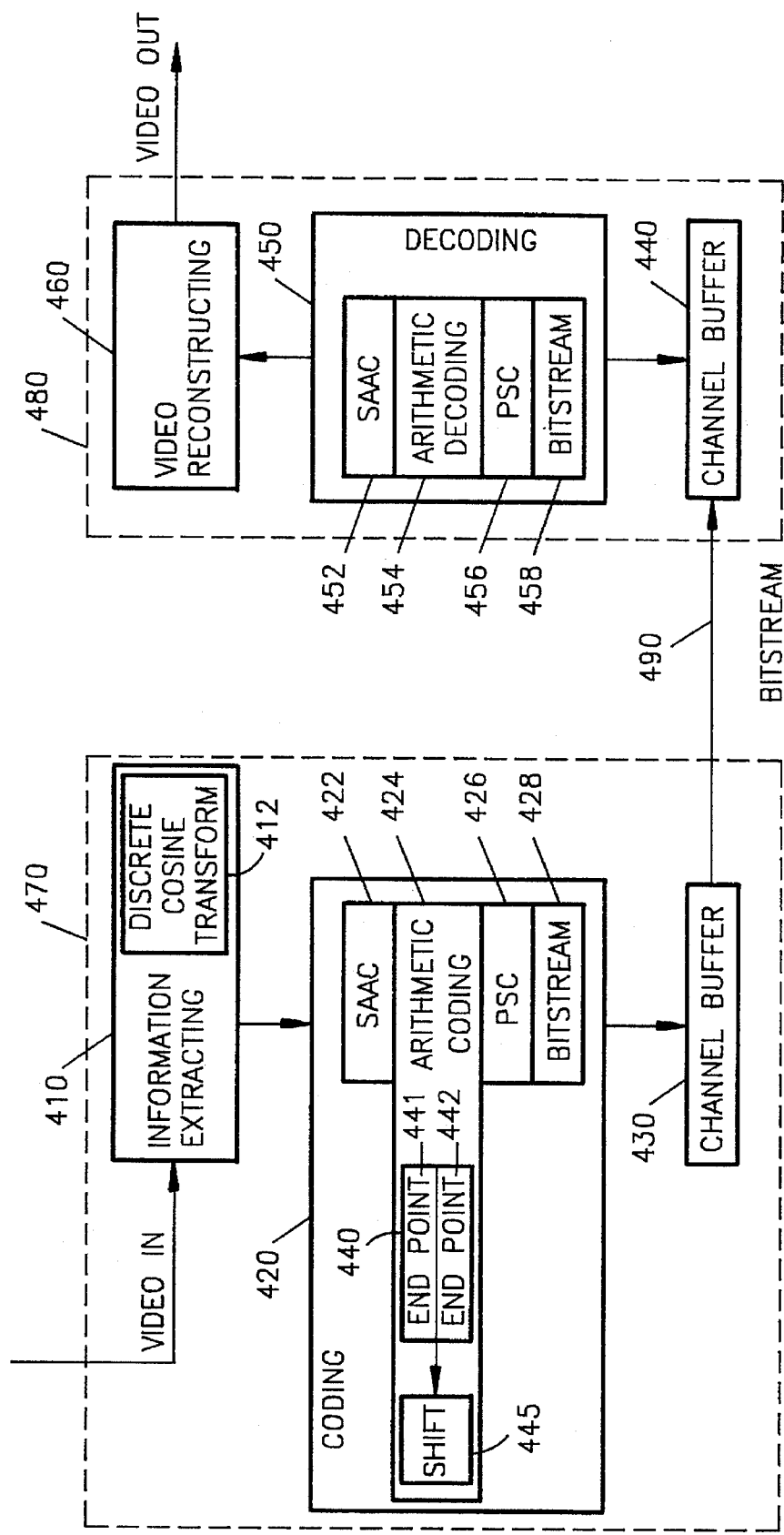
FIG. 4 is a block diagram of video encoding and decoding portions of a pair of videophones in accordance with an embodiment of this invention.

FIG. 4 shows a video encoding portion 470 of a first videophone connected via a channel 490 to a video decoding portion 480 of a second videophone. Channel 490 is a relatively low bit rate channel (less than 28.8 kbit/s) such as provided by a standard phone line using modems. The actual available bit rate for video transmission over channel 490 could be less (about 8 to 20 kbit/s) because some of the bandwidth of channel 490 is for audio transmission. Video encoding portion 470 receives an input signal VIDEO_IN from devices (not shown) such as a CCD (charge coupled device) camera and a digitizer. Signal VIDEO_IN includes a series of digital values which form two-dimensional arrays of pixel values for frames of a moving image. The pixel values may for example indicate intensity for a grayscale image or color components such as standard RGB or YUV components. The example of pixel values that are YUV color components is described herein.

Information extracting unit 410 processes the two-dimensional arrays of pixel values to generate a message that requires fewer bits to describe the moving image. Information extracting unit 410 can be implemented in software executed on a general purpose digital signal processor such as a computer which receives digital input signal VIDEO_IN and stores and processes the digital values. Alternatively, information extracting block may be implemented in hardware or a combination of customized hardware and firmware. One embodiment of information extracting unit 410 is the source coder described by X. Ran, "Draft Recommendation H.26P (TMN4Rev1 changes included) (Video coding for narrow telecommunication channels at <64 kbit/s)", ITU Telecommunication Standardization Sector, Study Group 15, Working Party 15/1, Expert's Group LBC-94-, October 1994 which is incorporated by reference here in its entirety.

Information extracting unit 410 performs a discrete cosine transformation (DCT) 412 on inter-blocks and intra-blocks and then quantizes the DCT coefficients, for example by dividing each coefficient by a fixed step size and rounding the result to a fixed number of bits indicating a level.

For each 16-by-16 block in the current frame, information extracting unit 410 converts six 8-by-8 blocks of a macroblock into six series of symbols. The 64 coefficient of a 8-by-8 block are considered in a zig-zag order shown in FIG. 5 when determining a series of symbols for the block. Each symbol indicates one non-zero coefficient and contains a bit which indicates if the symbol is the last in the series, bits which indicate the length of a run of zero coefficients occurring before the non-zero coefficient, and bits indicating the level of the non-zero coefficient. In the syntax of FIG. 3, a series of symbols representing an intra-block is one symbol INTRADC followed by repeated occurrences of symbol TCOF, and a series of symbols representing an inter-block is repeated occurrences of symbol TCOF.

Figure 7A:
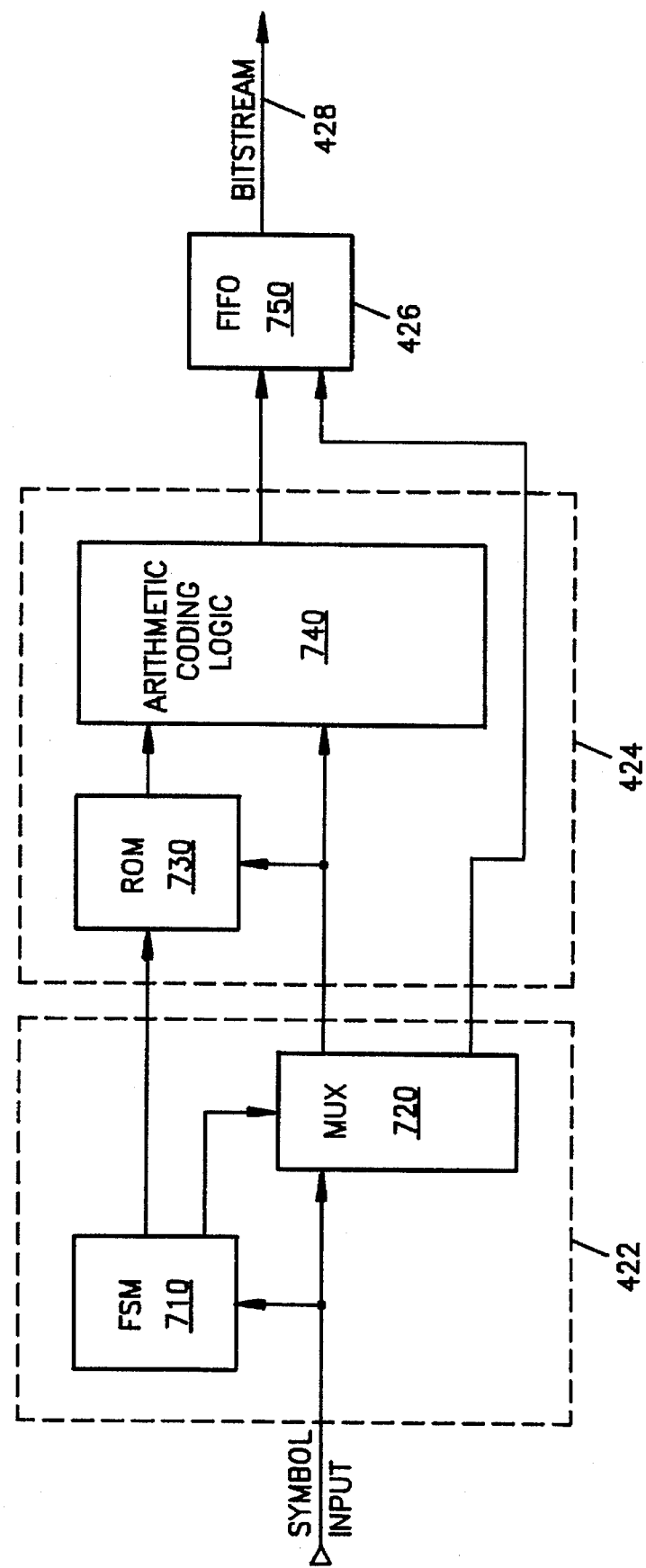
FIGS. 7A and 7B show block diagrams of syntax-based encoding and decoding units in accordance with an embodiment of this invention.

Information extracting unit 410 of FIG. 4 provides to a coding unit 420 values for the symbols indicated in FIG. 3 in the order defined by FIG. 3. Coding unit 420 consists of four layers, a syntax-based adaptive arithmetic coder (SAAC) layer 422, an arithmetic coding layer 424, a picture start code (PSC) layer 426, and a bitstream layer 428. Each layer may be implemented in hardware, software, firmware, or a combination of the three. FIG. 7A shows a block diagram of a hardware embodiment of coding unit 420. The microfiche appendix contains a software embodiment.

SAAC layer 422 and arithmetic coding layer 424 perform syntax-based adaptive arithmetic coding in accordance with an embodiment of the invention. SAAC layer 422 receives a symbol value from information extracting unit 410 and selects an arithmetic coding model that arithmetic layer 424 uses for the symbol. SAAC layer 422 selects the correct model for a symbol according to the syntax of the message. For the syntax of FIG. 3, each symbol value received by SAAC corresponds to one of symbols PSC, TR, PTYPE, QUANT, PEI, SPARE, GBSC, GN, COD, CBPCM, CBPY, DQUANT, MV, INTRADC, and TCOF. SAAC layer 422 selects different arithmetic models for symbols COD, CBPCM, CBPY, DQUANT, MV, INTRADC, and TCOF and directs arithmetic coding layer 424 to encode each of those symbols as part of a single code. Symbols PSC, TR, PTYPE, QUANT, PEI, SPARE, GBSC, GN are fixed length coded by routing the symbols past arithmetic coding layer 424 to a PSC layer described below.

Figures 5, 6:
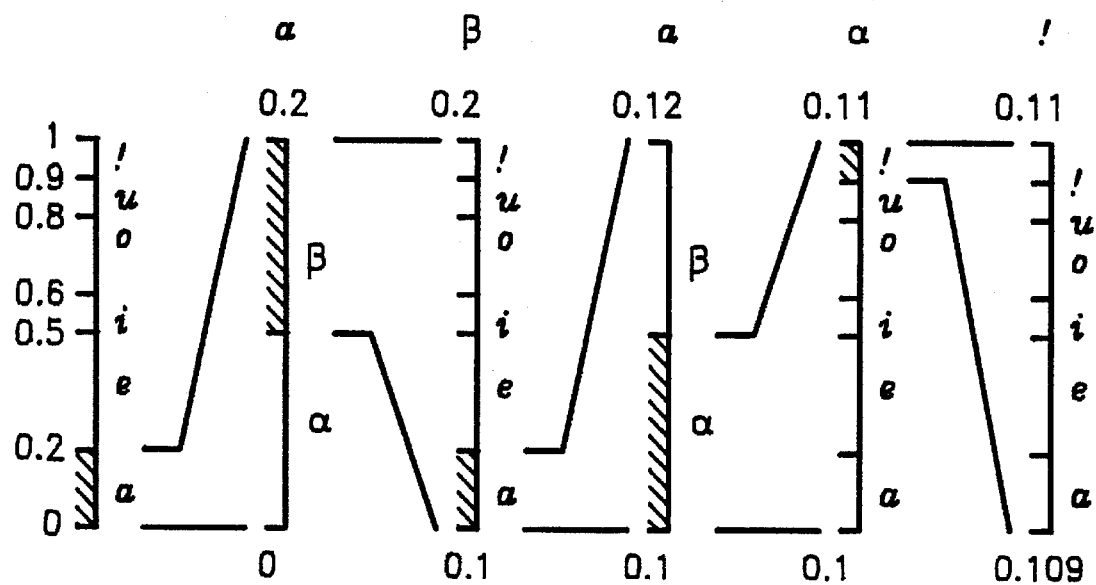
FIG. 5 shows an order in which coefficients of a block are evaluated during generation of symbols representing the block.
FIG. 6 illustrates a process of encoding and decoding a string of symbols using adaptive arithmetic coding in accordance with an embodiment of this invention.

Arithmetic coding layer 424 encodes each symbol using the corresponding arithmetic coding model selected by SAAC layer 422. FIG. 6 illustrates an example of syntax-based adaptive coding where arithmetic coding layer 422 receives a string of symbols having values aβaα!. The first, third, and fifth symbol values (a, a, and !) are for symbols which the syntax indicates has six possible values {a, e, i, o, u, !}. The arithmetic coding model for the first, third, and fifth symbol is based on statistical probabilities of each value, 20%, 30%, 10%, 20%, 10%, and 10% for symbol values a, e, i, o, u, and ! respectively. The second and fourth symbol value are for symbols having two possible values {α, β} where both values have the same probability 50%.

Encoding the string αβαα! as a code value in the interval [0,1) proceeds as follows. SAAC layer 422 receives the first symbol value a from information extracting unit 410 and selects from memory the model indicating probabilities 20%, 30%, 10%, 20%, 10%, and 10%. Arithmetic coding layer 424 divides the interval [0,1) into segments [0,0.2), [0.2,0.5), [0.5,0.6), [0.6,0.8), [0.8,0.9), and [0.9,1) according to the model, and then selects interval [0,0.2), the interval corresponding to symbol value a. The final code value has the form 0.00x because the code value is in the interval [0,0.2) and therefore less than 0.01 binary. Arithmetic coding layer 424 transmits two bits 00 to PSC layer 426 indicating the first two bits in the code value.

For the second symbol value β, SAAC layer 422 selects the model indicating probabilities 50% and 50%. Arithmetic coding layer divides the selected interval [0,0.2) into segments [0,0.1) and [0.1,0.2) according to the model from SAAC layer 422 and then selects interval [0.1,0.2), the interval corresponding to symbol value β. No new bits can be sent to PSC layer 426 because the interval [0.1,0.2) contains values greater and less than 0.001 binary. Interval [0.1,0.2) is divided according to the model for the third symbol, and interval [0.1,0.12) is selected according to the symbol value a. Bits 011 are sent to PSC layer 426 indicating the code will be less than 0.001 binary but greater than 0.00011 binary. Interval [0.1,0.12) is divided according to the model for the fourth symbol, and interval [0.1,0.11) is selected for symbol value α. No bit is sent to PSC layer 426 because 0.000111 binary is in the interval [0.1,0.11). Finally, interval [0.1,0.12) is divided according to the model for the fifth symbol and interval [0.109,0.11) is selected for symbol value !. Bit 1 is sent to indicate a code value 0.109375 which is 0.000111 binary. For the example of FIG. 4, arithmetic coding layer 424 transmits six bits 000111 to PSC layer 426 in order most significant to least significant bits and uniquely represents the string of symbol values αβαα!.

As an interval is successively divided, the end point values 441 and 442 of the selected intervals must be known to higher and higher precision, but the memory locations 440 which store the end points values 441 and 442 have precision limited to a fixed number of bits. However, after transmission of a bit from arithmetic coding layer 424, the most significant bit of both end points values 441 and 442 must be equal and are not required for further coding. Accordingly, a shift 445 removes the most significant bit from memory locations 440 to provide room for a least significant bit and provide higher precision. When a selected interval has an upper end point above 0.1 binary but below 0.11 binary and has a lower end point below 0.1 binary but above 0.01 binary, arithmetic coding layer 424 attempts to determine two or more code bits before any code bits are sent. Subroutine en_a_symbol in Appendix A in the microfiche appendix shows one technique which determines multiple code bits without overflowing the precision of the memory locations storing the end points.

PSC layer 426 is basically a FIFO buffer which receives bits from arithmetic coding layer 424 and SAAC layer 422 and checks for a bit sequence which could give a false PSC (picture start code). If such a bit sequence occurs, an extra bit is stuffed into the sequence. For example, if the PSC is 1000 0000 0000 0001 0000 and sequence 1000 0000 0000 0001 000 occurs in PSC layer 426, PSC layer 426 checks a flag signal from SAAC layer 422 to determine if a PSC is being transmitted. If a PSC is not being transmitted, PSC layer 426 changes a 19-bit series 1000 0000 0000 0001 000 to a 20-bit series 1000 0000 0000 0001 0001.

Bitstream layer 428 moves bits from PSC layer 426 to an output channel buffer 430. Bits from output channel buffer 430 are transmitted across channel 490 to an input channel buffer 440 in decoding portion 480 of the second video phone. A bitstream layer 458 in a decoding unit 450 moves bits from input channel buffer 440 into a PSC layer 456. PSC layer 456 changes a 20-bit series 1000 0000 0000 0001 0001 to a 19-bit series 1000 0000 0000 0001 000.

An arithmetic decoding layer 454 in decoding unit 450 receives bits from PSC 456 and decodes the bits according to models provided by an SAAC layer 452. For example, SAAC layer 452 selects a first model for arithmetic decoding layer 454, and arithmetic decoding layer 454 retrieves a number of bits from PSC layer 456 to determine which interval of the model is indicated by the code. Arithmetic decoding layer 454 then sends a corresponding symbol to SAAC layer 452. SAAC layer 452 sends the decoded symbol value to a video reconstructing unit 460, and selects the arithmetic coding model arithmetic decoding layer 454 uses when decoding the next symbol. Video reconstructing unit 460 receives decoded symbols from decoding unit 450 and performs the inverse of the operation performed by information extracting unit 410.

FIG. 6 can also be used to illustrate the syntax-based arithmetic decoding process. Initially, SAAC layer 452 selects a model for the first symbol. Arithmetic decoding layer 454 receives the first bit which is zero and determines that the first symbol value is either a or e, the symbol values in the bottom half of interval [0,1). Arithmetic decoding layer 454 receives the second bit, which is also zero, and determines that the first symbol value is a. SAAC layer receives the value a and selects the next arithmetic coding model for partitioning the interval [0,0.2). Arithmetic decoding layer 454 receives the third bit which is 1, and determines the code value is in the top half of interval [0,0.2) therefore the second symbol is β. SAAC layer 452 selects the next model 630 based on the preceding symbol values a and β. Decoding proceeds a bit at a time in this fashion until SAAC determines ! is the last symbol in the string.

FIG. 7A shows a block diagram of a hardware embodiment of encoding unit 420. In encoding unit 420, SAAC layer 422 includes a finite state machine (FSM) 710 which monitors symbols from information extracting unit 410 and generates signals indicating a state defined by the syntax of the message being encoded. Such state machines are well known in the art and may be a part of SAAC layer as shown in FIG. 7A. Alternatively, the functions of FSM 710 may be combined with the function of a state machine in information extracting unit 410. An output signal from FSM 710 selects address of memory location in memory 730 containing values which define an arithmetic coding model. FSM 710 also controls a multiplexer 720. Symbols to be encoded are routed through multiplexer 720 to arithmetic coding logic 740 in arithmetic coding layer 424. Arithmetic coding logic 740 uses the symbol value and the model from memory 730 to generate bits of a code value which are written to a FIFO buffer 750. Symbols that are not to be encoded by arithmetic coding layer 424 are routed through multiplexer 720 directly to FIFO buffer 750. From FIFO buffer 760, bits are fed into bitstream 428 and channel 490.

Figure 7B:
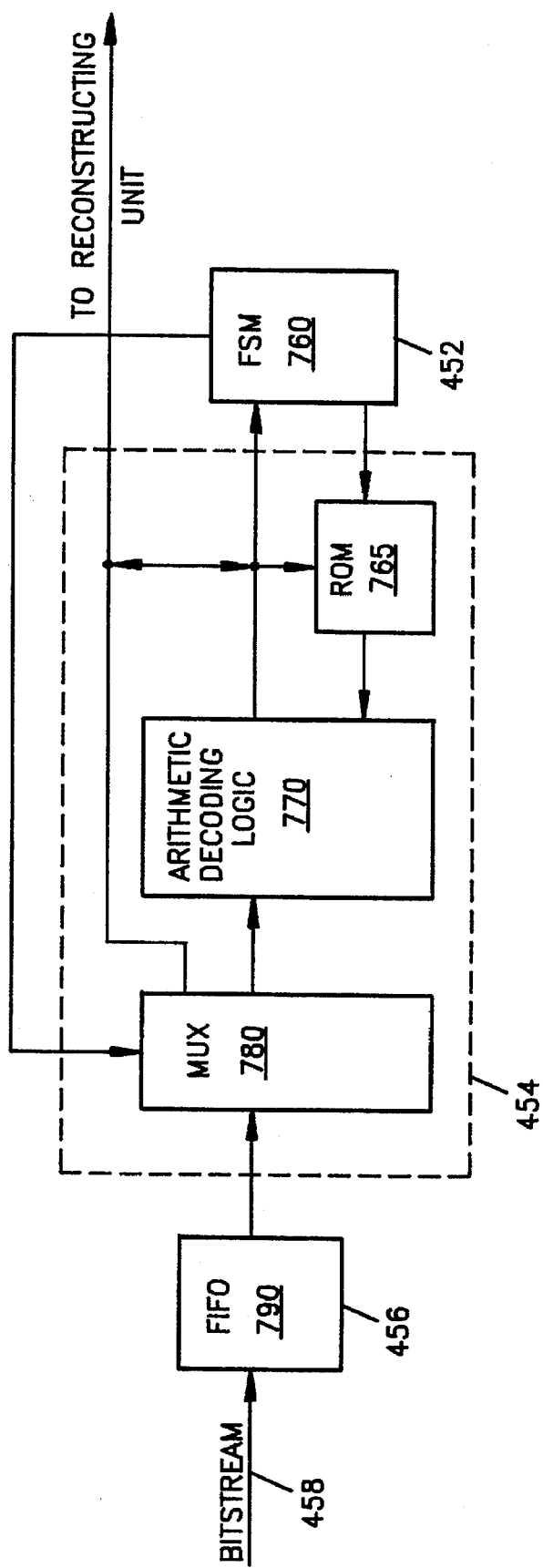

FIG. 7B shows a block diagram of a decoding unit 450. Decoding unit 450 contains a FIFO buffer 790 which receives bits from bit stream 458. Bits are read from FIFO buffer 790 pass through a multiplexer 780 which is controlled by a finite state machine (FSM) 760. Bits which make up fixed length symbols are routed through multiplexer 780 to reconstructing unit 460. Bits to be decoded are routed to arithmetic decoding logic 770. Arithmetic decoding logic 770 converts bits from the bitstream into symbols using an arithmetic coding model stored in a memory 765. FSM 760 selects the appropriate arithmetic coding model according to the previous symbol either from arithmetic coder 770 or FIFO 790.

FIG. 6 provides an illustrative example of syntax-based arithmetic coding of a string. For actual symbols such as defined by the syntax of FIG. 3, the numbers of possible values and statistical distributions will differ from those given in the example of FIG. 6. The actual statistical distributions of a symbol can be determined by observing the values of the symbol during encoding of video images.

Arithmetic coding models for symbols to be encoded can be generated off-line and stored in memory before operation of a videophone. However, if desired, models can be updated, by counting the occurrences of each value for a symbol during operation. The counts can be occasionally normalized, for example by dividing each count by a fixed value, to stop any count from exceeding the capacity of its storage location. Updating the models during operation allows the models improve for the particular use of the videophone and causes coding become more efficient for the particular application.

In addition to providing models corresponding to different symbols, multiple models can be used for some symbols. For example, some symbols such as symbol TCOF in the syntax of FIG. 3 occur many times in a typical message, and an arithmetic coding model can be selected not only according to the symbol but also according to the order of occurrence of the symbol in the message.

Figure 8A:
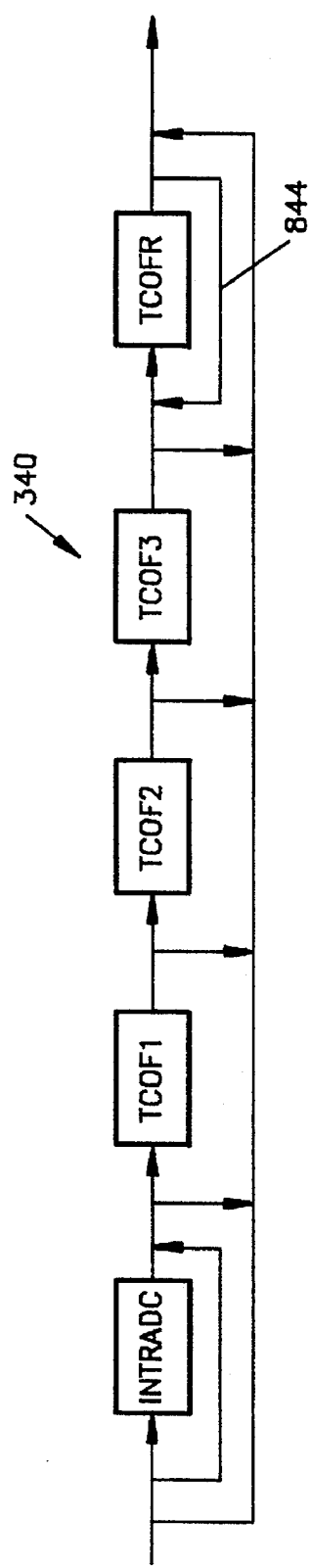
FIGS. 8A and 8B illustrate alternative syntaxes for arithmetic encoding in accordance with this invention.

FIG. 8A shows an expanded version of block layer 340 from the syntax illustrated in FIG. 3. A loop 344 which repeats symbol TCOF in FIG. 3 is replaced by symbols TCOF1, TCOF2, and TCOF3 (which are the first three occurrences of symbol TCOF in loop 344) and a loop 844 which repeats symbol TCOFR as many times as is required to represent the DCT coefficients of an 8-by-8 block. Each symbol TCOF1, TCOF2, TCOF3, and TCOFR has a value which contains a bit indicating if the symbol is the last in the series, bits indicating the length of a run of zero values occurring before a non-zero coefficient, and bits indicating the level of the non-zero coefficient. DCT transformations commonly concentrate non-zero coefficients in top-left corner of a block of coefficients. Additionally, the non-zero coefficients near the top-left of a block tend to be larger than the other coefficients in the block. Thus, symbol TCOF1 representing the first non-zero coefficient found along the order shown in FIG. 5 tends to have a high level and a low run of zero coefficients. In contrast, a non-zero coefficient encoded later according to the order given in FIG. 5 tends to be preceded by longer runs of zero valued coefficients and tends to have a smaller level. To account for the different statistical distributions of values for symbols TCOF1, TCOF2, TCOF3, and TCOFR, different models can be used for each of symbols TCOF1, TCOF2, TCOF3, and TCOFR. Additionally, models can be distinguished according to whether the DCT coefficient described are for an intra-block or an inter-block.

The process of FIG. 8A uses four different arithmetic coding models for different occurrences of symbol TCOF of FIG. 3. Alternatively, more or fewer models can be used for symbol TCOF. Adding models improves the efficiency of coding but increases the memory required to store the models. Testing has indicated that the improvement in coding efficiency per amount of memory drops sharply beyond four arithmetic coding models.

Figure 8B:
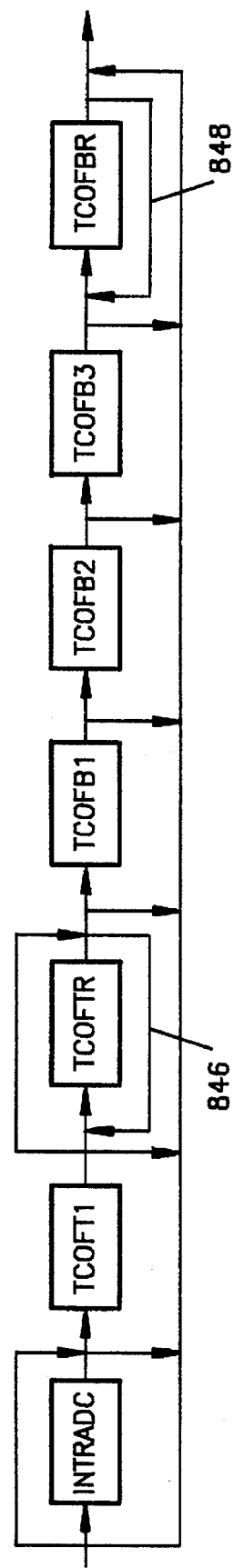

FIG. 8B shows another expanded version of block layer 340 from the syntax illustrated in FIG. 3. In FIG. 8B, loop 344 repeating symbol TCOF is divided into symbols TCOFT1, TCOFTR, TCOFB1, TCOBF2, TCOFB3, and TCOFBR, each of which has a corresponding arithmetic coding model. The symbols TCOF are determined in the manner as described above and contain run lengths of zero values along the order shown in FIG. 5, but the message syntax of FIG. 8B sends the symbols in reverse order. Symbol TCOFT1 contains a level for the last non-zero DCT coefficient found along the order given in FIG. 5. Accordingly, symbol TCOFT1 corresponds to the tail of the series of symbols found using the order of FIG. 5.

Symbol TCOFTR which is repeated in loop 846 is also near the tail of the order. Loop 846 repeats symbol TCOFTR until the level indicated by a value of symbol TCOFTR rising above a threshold level. If the level indicated is greater than the threshold value, the next symbol is TCOFB1. This separation of arithmetic models according to level is found to provide very efficient coding. After the level indicated reaches the threshold, four more arithmetic models are used. The final model for symbol TCOFBR is repeated as many times as necessary if there are more than six symbol describing the DCT coefficients of a block.

A C programming language listings in appendices A to F in the microfiche appendix represent software implementations of embodiments of this invention. Appendix A contains an embodiment encoding portion 470 including information extracting unit 410, SAAC layers 422, arithmetic coding layer 424, PSC layers 426, and bitstream layers 428 for a syntax given in FIGS. 3 and 8B. Appendix B contains listing of subroutines which replace subroutines of the same names in Appendix A to create an embodiment of the invention for the syntax of FIGS. 3 and 8A. Appendix C contains listing of subroutines which replace subroutines of the same names in Appendix A to create an embodiment of the invention for the syntax of FIG. 3 where eight different models are used for symbol TCOF of FIG. 3.

Appendix D contains an embodiment of decoding portion 480 including information reconstructing unit 460, SAAC layers 452, arithmetic decoding layer 454, PSC layers 456, and bitstream layers 458 for a syntax given in FIGS. 3 and 8B. Appendices E and F contain listing of subroutines for creating an embodiment of decoding portion 480 corresponding to the embodiments of Appendix B and C.

In Appendix A, matrices cumf__COD[3], cumf__MCBPC [18], cumf__CBPY[17], cumf__DQUANT[5], cumf__MVD [65], cumf__INTRADC[255] indicate a division of intervals according to model for symbols COD, MCBPC, CBPY, DQUANT, MV, and INTRADC, respectively. Matrices cumf__LRLSTa[123] and cumf__LRLSTb[123] indicate models for symbols TCOFT1 and TCOFTR respectively. Matrices cumf__LRLSBa[104], cumf__LRLSBb[104], cumf__LRLSBc[104], cumf__LRLSBd[104] are models for TCOFB1, TCOFB2, TCOFB2, and TCOFBR, respectively, when the DCT coefficients describe an inter-block. Matrices cumf__LRLSB1a[104], cumf__LRLSB1b[104], cumf__LRLSB1c[104], cumf__LRLSB1d[104] are models for TCOFB1, TCOFB2, TCOFB2, and TCOFBR when the DCT coefficients describe an intra-block.

Although the present invention has been described with reference to particular embodiments, the description is only an example of the invention's application and should not be taken as a limitation. Various other adaptations and combinations of features of the embodiments disclosed will be apparent to those skilled in the art and are within the scope of the present invention as defined by the following claims.

I claim:

1. A method for encoding a string of symbol values, comprising:

selecting an interval to contain a code value;

selecting a first arithmetic coding model, wherein the first arithmetic coding model is associated with a first symbol in a syntax for the string and partitions the interval into a set of first segments that correspond one-to-one with possible values for the first symbol;

changing the interval to contain the code so that the interval is equal to the one of the first segments which corresponds to a first symbol value in the string;

selecting a second arithmetic coding model which differs from the first arithmetic coding model, wherein the second arithmetic coding model is associated with a second symbol in the syntax for the string and partitions the interval into a set of second segments that correspond one-to-one with possible values for the second symbol; and generating a code value which is contained in the one of the second segments that corresponds to a second symbol value in the string.

2. The method of claim 1, wherein the syntax for the string defines symbol types for symbols, and each symbol type indicates a range of possible symbol values for a symbol.

3. The method of claim 2, wherein the first symbol and the second symbol are of the same symbol type.

4. The method of claim 3, wherein each of the first segments has a length proportional to the statistical probability of the first symbol having the symbol value corresponding to the segment, each of the second segments has a length proportional to the statistical probability of the second symbol having the symbol value corresponding to the segment, and differences between the first arithmetic coding model and the second arithmetic coding model reflect differences between statistical probabilities of values for the first symbol and statistical probabilities of values for the second symbol.

5. The method of claim 1, wherein for each symbol, the method further comprises:

selecting an arithmetic coding model which is associated with the symbol and partitions the interval into a set of segments that correspond one-to-one with possible values for the symbol, wherein the first arithmetic coding model is associated with the first symbol, and the second arithmetic coding model value is associated with the second symbol; and changing the interval so that the interval is equal to the segment which, according to the selected arithmetic coding model, corresponds to the symbol's value from the string.

6. The method of claim 1, wherein each of the first segments has a length proportional to the statistical probability of the first symbol having the symbol value corresponding to that first segment, and each of the second segments has a length proportional to the statistical probability of the second symbol having the symbol value corresponding to that second segment.

7. An apparatus for transmitting a video image, comprising:

an information extracting block which generates a series of symbol values representing the video image, wherein each symbol value corresponds to a symbol in a syntax for the series; and a coding block operably coupled to receive the series of symbol values from the information extracting block, wherein the coding block comprises:

a memory containing information describing a first arithmetic coding model which is associated with a first symbol in the syntax for the series and a second arithmetic coding model which differs from the first arithmetic coding model and is associated with a second symbol in the syntax for the series;

a state machine operably connected to the memory, wherein the state machine selects the first model in response to receiving a symbol value for the first symbol and selects the second model in response to receiving a symbol value for the second symbol in the syntax; and an arithmetic coder operably connected to the memory and the information extracting block, wherein the arithmetic coder uses the information which describes the model selected by the state machine for a symbol when the arithmetic coder encodes the symbol's value in an arithmetic code.

8. The apparatus of claim 7, wherein the information describing the first arithmetic coding model indicates statistical probabilities of symbol values of the first symbol.

9. The apparatus of claim 8, wherein the arithmetic coder comprises:

memory locations for storing a first binary value and a second binary value, wherein the first and second values represent boundaries of a first interval;

means for changing the first and second binary values to indicate boundaries of a second interval, wherein the boundaries of the second interval depend on the first binary value, the second binary value, the arithmetic coding model selected by the state machine, and a symbol value to be encoded; and means for generating a code bit when the most significant bit of every value in the second interval is the same.

10. The apparatus of claim 9, wherein the arithmetic coder further comprises means for shifting the most significant bit out of the first and second value when a code bit is generated.

11. The apparatus of claim 7, wherein the coding block further comprises a multiplexer controlled by the state machine, wherein the multiplexer receives the symbol values from the extracting block and either provides a symbol value to the arithmetic coder or bypasses the arithmetic coder, wherein for a third symbol, the state machine causes the multiplexer to bypass the arithmetic coder.

12. A method encoding a string of symbol values, comprising:

performing a discrete cosine transform on a block of values representing an area in a moving image, wherein the discrete cosine transform generates a block of transform coefficients; and generating the string of symbol values from the block of transform coefficients;

selecting an interval to contain a code value;

selecting a first arithmetic coding model, wherein the first arithmetic coding model is associated with a first symbol in a syntax for the string and partitions the interval into a set of first segments that correspond one-to-one with possible values for the first symbol;

changing the interval to contain the code so that the interval is equal to the one of the first segments which corresponds to a first symbol value in the string;

selecting a second arithmetic coding model, wherein the second arithmetic coding model is associated with a second symbol in the syntax for the string and partitions the interval into a set of second segments that correspond one-to-one with possible values for the second symbol; and generating a code value which is contained in the one of the second segments that corresponds to a second symbol value in the string.

13. The method of claim 2, wherein the first symbol and the second symbol both represent transform coefficients.

14. The method of claim 13, wherein the first symbol and the second symbol are symbols of the same type, and each of the first and second symbols contains bits which indicate a length for a run of zero transform coefficients occurring before a non-zero transform coefficient and bits indicating a level for the non-zero transform coefficient.

15. The method of claim 12, wherein the block of values comprises pixel values for the area in a frame of the moving image.

16. The method of claim 12, wherein the block of values represents a difference between the area in a first frame of the moving image and the area in a second frame of the moving image.

17. A method for decoding a bit stream representing a string of symbol values, the method comprising:

storing bits from the bit stream in a FIFO buffer;

storing a first binary value and a second binary value in a memory;

selecting an arithmetic coding model for a first symbol in the string;

determining, from the selected arithmetic coding model, boundaries of segments which constitute a partition of an interval bounded by the first and second binary values, wherein the segments are in one-to-one correspondence with possible symbol values;

detecting that a selected one of the segments contains all binary values which have most significant bits equal to one or more oldest bits from the FIFO buffer; and determining the symbol value that corresponds to the selected segment.

18. The method of claim 17, further comprising:

removing from the FIFO buffer a least number of oldest bits for which all possible binary values that begin with those oldest bits are within the selected segment;

shifting the first and second binary value by the number of bits removed from the FIFO buffer;

selecting an arithmetic coding model for the next symbol in the string; and repeating the last three steps of claim 17.

19. A method for generating a coded bit stream representing values for symbols in a string, the method comprising:

storing a first binary value and a second binary value in a memory, wherein the first and second values represent boundaries of an interval; and for each symbol given by a syntax for the string:

determining, from the syntax, an arithmetic coding model for that symbol;

changing the first and second binary values to indicate new boundaries for the interval, wherein the new boundaries depend on old boundaries for the interval, the arithmetic coding model for that symbol, and a value provided for the symbol by the string; and in response to every value within the interval having the same most significant bit, transmitting the most significant bit and shifting the first and second binary values to remove the most significant bit.

* * * * *